(12) United States Patent
Zhang

(10) Patent No.: US 7,400,169 B2
(45) Date of Patent: Jul. 15, 2008

(54) INDUCTOR-TUNED BUFFER CIRCUIT WITH IMPROVED MODELING AND DESIGN

(75) Inventor: Bo Zhang, Las Flores, CA (US)

(73) Assignee: Broadcom Corporation, Irvine, CA (US)

( * ) Notice: Subject to any disclaimer, the term of this patent is extended or adjusted under 35 U.S.C. 154(b) by 74 days.

(21) Appl. No.: 11/507,896

(22) Filed: Aug. 22, 2006

(65) Prior Publication Data

US 2008/0061828 A1 Mar. 13, 2008

(51) Int. Cl.
*H03K 19/0175* (2006.01)
*H03K 19/094* (2006.01)
*H03K 19/20* (2006.01)

(52) U.S. Cl. .............................. 326/81; 326/68; 326/80; 326/115

(58) Field of Classification Search .................... 326/62, 326/81, 83, 112, 115, 119, 121; 327/108, 327/333

See application file for complete search history.

(56) References Cited

U.S. PATENT DOCUMENTS

| | | | | |
|---|---|---|---|---|
| 6,340,899 | B1 * | 1/2002 | Green | 326/115 |
| 6,650,163 | B1 * | 11/2003 | Burns et al. | 327/295 |
| 7,126,403 | B2 * | 10/2006 | Kenney et al. | 327/291 |
| 7,190,232 | B1 * | 3/2007 | Teo | 331/36 C |
| 2002/0017921 | A1 * | 2/2002 | Green | 326/82 |

* cited by examiner

*Primary Examiner*—Rexford Barnie
*Assistant Examiner*—Dylan White
(74) *Attorney, Agent, or Firm*—Farjami & Farjami LLP

(57) ABSTRACT

According to one exemplary embodiment, an inductor-tuned buffer circuit includes at least one input transistor for receiving a time varying input signal, where the at least one input transistor drives an output of the buffer circuit. The buffer circuit further includes a buffer inductor coupled to the output of the buffer circuit. The buffer circuit is utilized to drive a capacitive load through an interconnecting conductor, where the buffer inductor is situated in proximity to the capacitive load so as to cause a parasitic inductance of the interconnecting conductor to be less than, or much less than, the buffer inductor.

16 Claims, 3 Drawing Sheets

US 7,400,169 B2

INDUCTOR-TUNED BUFFER CIRCUIT WITH IMPROVED MODELING AND DESIGN

BACKGROUND OF THE INVENTION

1. Field of the Invention

The present invention is generally in the field of electronics. More particularly, the present invention is in the field of electrical circuit design.

2. Background

A buffer circuit can be configured to receive a time varying input signal, such as a clock signal, and to output a corresponding time varying output signal with a greater load driving capability. For example, such buffer circuits can be critical in systems where a clock signal must be distributed to large loads.

In one type of conventional buffer circuit, inductors are used to "tune" the buffer circuit. The tuning is performed by estimating the total capacitive load to be driven by the buffer circuit and using appropriate buffer inductance values to achieve a desired resonance frequency, coinciding with the clock signal frequency. Since the buffer circuit provides high impedance when operating at the resonance frequency, it can provide a more stable output capable of driving large loads. Moreover, the high impedance reduces the buffer's power consumption.

However, parasitics, such as parasitic inductances, which exist in the interconnecting conductors between the buffer circuit and the capacitive load can cause the operation frequency of the buffer circuit to shift away from the desired resonance frequency. In addition, there may be interconnect resistances (e.g., metal resistance) between the buffer circuit and the loads, which can result in increased power consumption. Thus, the proper design and operation of the conventional buffer circuit typically requires highly accurate models (i.e., highly accurate approximations) of the parasitics in the interconnecting conductors. However, such accurate models of the parasitics can be both difficult and time consuming to determine and implement.

Thus, there is a need in the art for an inductor-tuned buffer circuit that allows for an improved modeling and design of the buffer circuit.

SUMMARY OF THE INVENTION

An inductor-tuned buffer circuit with improved modeling and design, substantially as shown in and/or described in connection with at least one of the figures, as set forth more completely in the claims.

DETAILED DESCRIPTION OF THE INVENTION

The present invention is directed to an inductor-tuned buffer circuit with improved modeling and design. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
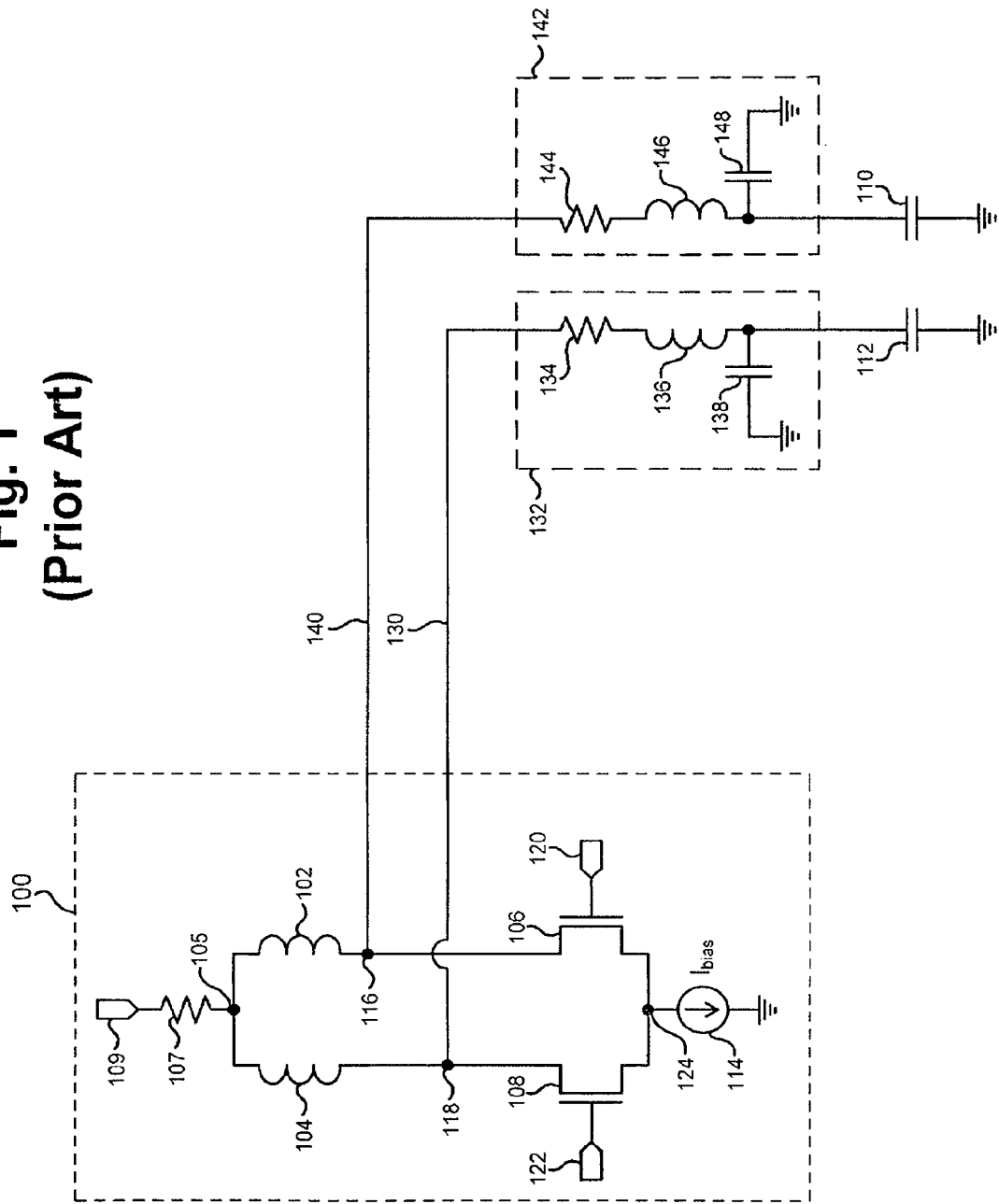
FIG. 1 illustrates a conventional buffer circuit design.

FIG. 1 shows conventional inductor-tuned buffer circuit 100, which can be used to buffer a time varying input signal. Buffer circuit 100 includes buffer inductors 102 and 104, input transistors 106 and 108, and current source ("$I_{bias}$") 114.

As shown in FIG. 1, in one embodiment, input transistors 106 and 108 are arranged in a differential pair configuration. Input transistors 106 and 108 are configured to receive a time varying input signal, such as a clock signal, at respective differential inputs 120 and 122, which are coupled to the respective gates of input transistors 106 and 108. As also shown in FIG. 1, a first terminal of buffer inductor 102 is coupled to the drain of transistor 106 at differential output node 116, while a first terminal of buffer inductor 104 is coupled to the drain of transistor 108 at differential output node 118. As further shown in FIG. 1, a second terminals of buffer inductors 102 and 104 are coupled to common mode resistor 107 at node 105. Common mode resistor 107 is coupled to supply voltage ("Vdd") 109, which can be a DC voltage. As shown in FIG. 1, the sources of input transistors 106 and 108 are coupled to current source 114 at node 124.

As shown in FIG. 1, buffer circuit 100 provides differential output signals at output nodes 116 and 118. Capacitive loads 110 and 112 represent, i.e. model, the cumulative capacitive load of the various inputs and circuits that are to be driven by differential output signals 116 and 118. For example, capacitive loads 110 and 112 can be used to model the total capacitive load of a large number of transistor gates used in various digital and analog circuits driven by differential output signals 116 and 118. Thus, for the purpose of circuit design and modeling and determining the appropriate values of (i.e. for the purpose of "tuning") buffer inductors 102 and 104, capacitive loads 110 and 112 are represented as single capacitors. However, those of ordinary skill in the art will recognize that capacitive loads 110 and 112 are used as an approximation or a model for a large number of diverse and distinct capacitive loads that are typically driven by differential output signals 116 and 118.

As shown in FIG. 1, capacitive load 112 is coupled to differential output node 118 via interconnecting conductor 130, and capacitive load 110 is coupled to differential output node 116 via interconnecting conductor 140. Interconnecting conductors 130 and 140 each have respective interconnect parasitic impedances 132 and 142, where each interconnect parasitic impedance is modeled by a resistor-inductor-capacitor ("RLC") circuit. As shown in FIG. 1, interconnect parasitic impedances 132 and 142 can, for example, respectively include interconnect parasitic resistances 134 and 144 which represent the respective parasitic resistances of interconnect conductors 130 and 140 (e.g., metal resistance), parasitic inductances 136 and 146 which represent the parasitic inductances of respective interconnect conductors 130 and 140, and parasitic capacitances 138 and 148 which represent the parasitic capacitances of respective interconnect conductors 130 and 140.

Buffer circuit 100 can receive, for example, differential clock signals at differential inputs 122 and 120. The differential clock signals can then be output by buffer circuit 100 at differential output nodes 118 and 116 with high drive capability to properly drive respective capacitive loads 112 and 110. Thus, the values of buffer inductors 102 and 104 in buffer circuit 100 are determined (i.e. "tuned") such that buffer inductors 102 and 104 and capacitive loads 110 and 112 resonate at the same frequency as the differential clock signals. At such resonance frequency, buffer circuit 100 achieves maximum output impedance and drive capability at differential output nodes 118 and 116.

Conventional buffer circuit 100, however, suffers from significant drawbacks in its design and modeling. In a typical design and implementation of conventional buffer circuit 100, for example, interconnecting conductors 130 and 140 can be undesirably long, causing an increase of respective parasitic inductances 136 and 146 and parasitic resistances 134 and 144. As parasitic inductances 136 and 146 increase, the resonance frequency of buffer circuit 100 shifts lower. To compensate for this shift, buffer inductors 102 and 104 may have to be reduced in order to shift the resonance frequency of buffer circuit 100 down to the desired resonance frequency. A reduction in the inductance values of buffer inductors 102 and 104 in turn results in increased sensitivity of buffer circuit 100 to parasitic impedances 132 and 142. Furthermore, the increase of parasitic resistances 134 and 144 can cause the quality factor ("Q") of buffer circuit 100 to decrease and causes increased power consumption. Further, in order to compensate for a lower Q and the loss of amplitude due to parasitic resistances 134 and 144, $I_{bias}$ 114 may have to be increased, causing a further increase in power consumption of buffer circuit 100.

In applications where buffer inductors 102 and 104 are very small and buffer circuit 100 is operating at high resonance frequencies (e.g., at resonance frequencies greater than 10.0 gigahertz), parasitic inductances 136 and 146 may undesirably approach the value of respective buffer inductors 102 and 104. As such, the precise tuning of buffer circuit 100, i.e. the selection of the appropriate values for buffer inductors 102 and 104 to achieve a desired resonance frequency, may require even more accurate models of parasitic inductances 136 and 146 in order for buffer circuit 100 to operate at the desired resonance frequency. Such accurate models of parasitic inductances 136 and 146, however, can be difficult to determine and implement, time consuming and costly.

Figure 2:
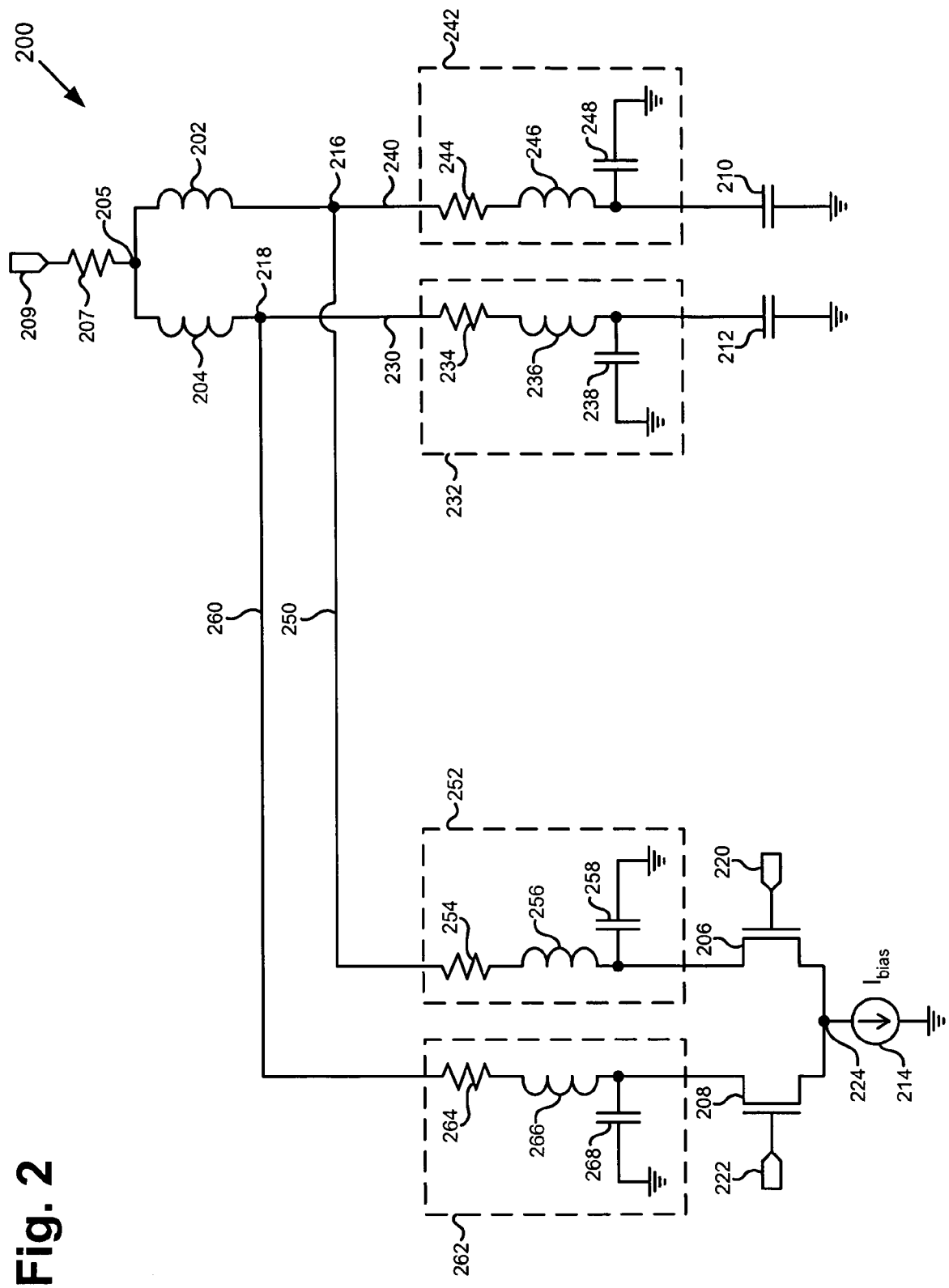
FIG. 2 illustrates an exemplary buffer circuit design allowing for improved modeling and tuning, in accordance with one embodiment of the present invention.

FIG. 2 shows inductor-tuned buffer circuit 200 in accordance with one embodiment of the present invention. As shown in FIG. 2, input transistors 206 and 208 are arranged in a differential pair configuration. For example, input transistors 206 and 208 can be NMOS or PMOS transistors. In other embodiments, input transistors 206 and 208 might be NPN or PNP bipolar transistors, or other types of transistors. As shown in FIG. 2, input transistors 206 and 208 are configured to receive time varying input signals, for example differential clock signals referred to in this application to describe the present invention, at respective differential inputs 220 and 222, which are coupled to the respective gates of input transistors 206 and 208. As also shown in FIG. 2, the first terminal of buffer inductor 202 is coupled to the drain of transistor 206 at differential output node 216 via interconnecting conductor 250, while the first terminal of buffer inductor 204 is coupled to the drain of transistor 208 at differential output node 218 via interconnecting conductor 260. The second terminals of buffer inductors 202 and 204 are coupled to common mode resistor 207 at node 205. Common mode resistor 207 is coupled to supply voltage ("Vdd") 209, which can be a DC voltage. As further shown in FIG. 2, the sources of input transistors 206 and 208 are coupled to current source ("$I_{bias}$") 214 at node 224.

As shown in FIG. 2, buffer circuit 200 provides differential output signals at differential output nodes 216 and 218. As also shown in FIG. 2, capacitive load 212 is coupled to differential output node 218 via interconnecting conductor 230, and capacitive load 210 is coupled to differential output node 216 via interconnecting conductor 240.

As also shown in FIG. 2, interconnecting conductors 250 and 260 have respective interconnect parasitic impedances 252 and 262, and interconnecting conductors 230 and 240 have respective interconnect parasitic impedances 232 and 242. Each interconnect parasitic impedance is represented by a resistor-inductor-capacitor ("RLC") circuit. For example, interconnect parasitic impedances 252 and 262 respectively include interconnect parasitic resistances 254 and 264 which represent the respective parasitic resistances of interconnect conductors 250 and 260 (e.g., metal resistance), parasitic inductances 256 and 266 which represent the parasitic inductances of respective interconnect conductors 250 and 260, and parasitic capacitances 258 and 268 which represent the parasitic capacitances of respective interconnecting conductors 250 and 260. Likewise, interconnect parasitic impedances 230 and 240 respectively include interconnect parasitic resistances 234 and 244, parasitic inductances 236 and 246, and parasitic capacitances 238 and 248.

In buffer circuit 200, buffer inductors 202 and 204 are moved to proximity of respective capacitive loads 210 and 212, thereby allowing the lengths of interconnecting conductors 230 and 240 to be advantageously reduced. Buffer inductors 202 and 204 are thus in greater proximity to capacitive loads 210 and 212 than input transistors 206 and 208. As a result, parasitic resistances 234 and 244 and parasitic inductances 236 and 246 are significantly reduced. However, since buffer inductors 202 and 204 are situated in proximity to capacitive loads 210 and 212, the respective parasitic impedances of interconnecting conductors 250 and 260, i.e. respective interconnect parasitic impedances 252 and 262, may increase. Thus, interconnect parasitic resistances 254 and 264, parasitic inductances 256 and 266, and parasitic capacitances 258 and 268 of respective interconnecting conductors 250 and 260 may increase accordingly.

As shown in FIG. 2, parasitic impedances 252 and 262 are in series with input transistors 206 and 208 which can be treated as current sources. More specifically, input transistor 206 and current source ("$I_{bias}$") 214 can be thought of as a single current source in series with interconnect parasitic resistance 254 and parasitic inductance 256, and in turn in series with the "loading network" which can be thought of as including parasitic capacitance 258, buffer inductor 202, interconnect parasitic impedance 242, and capacitive load 210. Likewise, input transistor 208 and current source ("$I_{bias}$") 214 can be thought of as a single current source in series with interconnect parasitic resistance 264 and parasitic inductance 266, and in turn in series with the "loading network" which can be thought of as including parasitic capacitance 268, buffer inductor 204, interconnect parasitic impedance 232, and capacitive load 212. The reason is that during the buffer circuit operation, all the current will alternately go through either the "current source" combination of input transistor 206 and current source ("$I_{bias}$") 214 or the "current source" combination of input transistor 208 and current source ("$I_{bias}$") 214 as explained above. Thus, parasitic inductances 256 and 266 and interconnect resistances 254 and 264 have a negligible effect on the resonance frequency and output amplitude of buffer circuit 200.

Therefore, the close proximity of buffer inductors 202 and 204 to capacitive loads 210 and 212 provides a substantial reduction of parasitic inductances 236 and 246 and interconnect parasitic resistances 234 and 244, while increasing the inconsequential parasitic inductances 256 and 266 and interconnect parasitic resistances 254 and 264. In one embodiment, buffer inductors 202 and 204 are placed close enough to capacitive loads 210 and 212 to ensure that each parasitic inductance 236 or 246 has a lower inductance than each respective buffer inductor 204 or 202. In another embodiment, buffer inductors 202 and 204 are placed close enough to capacitive loads 210 and 212 to ensure that each parasitic inductance 236 or 246 has a lower inductance than half of the inductance of each respective buffer inductor 204 or 202. In still another embodiment, buffer inductors 202 and 204 are placed very close to capacitive loads 210 and 212 to ensure that each parasitic inductance 236 or 246 has a much lower inductance (e.g., much less than half) than that of each respective buffer inductor 204 or 202.

Thus, by moving the buffer inductors close to the capacitive loads and thus shifting more of the parasitic inductances in series with the respective outputs of input transistors 206 and 208, the effect of the parasitic inductances associated with the capacitive loads on the resonance frequency of buffer circuit 200 is substantially reduced. The reduction of the effect of parasitic inductances 236 and 246 on the behavior of buffer circuit 200 results in a robust design that is less sensitive to accurate modeling of parasitic inductances or other parasitic impedances. Accordingly, buffer circuit 200 can be precisely tuned to a desired resonance frequency without requiring highly accurate models of parasitic impedances.

Buffer circuit 200 can also provide great power savings over conventional buffer circuit 100 since the value of parasitic resistances 234 and 244 is also reduced due to the close proximity of buffer inductors 202 and 204 to capacitive loads 210 and 212. Moreover, buffer circuit 200 will have a stable and high impedance output since the finely tuned buffer inductors 202 and 204 allow buffer circuit 200 to operate close to an optimal resonance frequency where buffer circuit 200 provides maximum output impedance. Due to the above factors, i.e. reduction of parasitic resistances 234 and 244 and operation at optimum resonance frequency, $I_{bias}$ 214 can also be advantageously reduced, resulting in further power savings.

Figure 3:
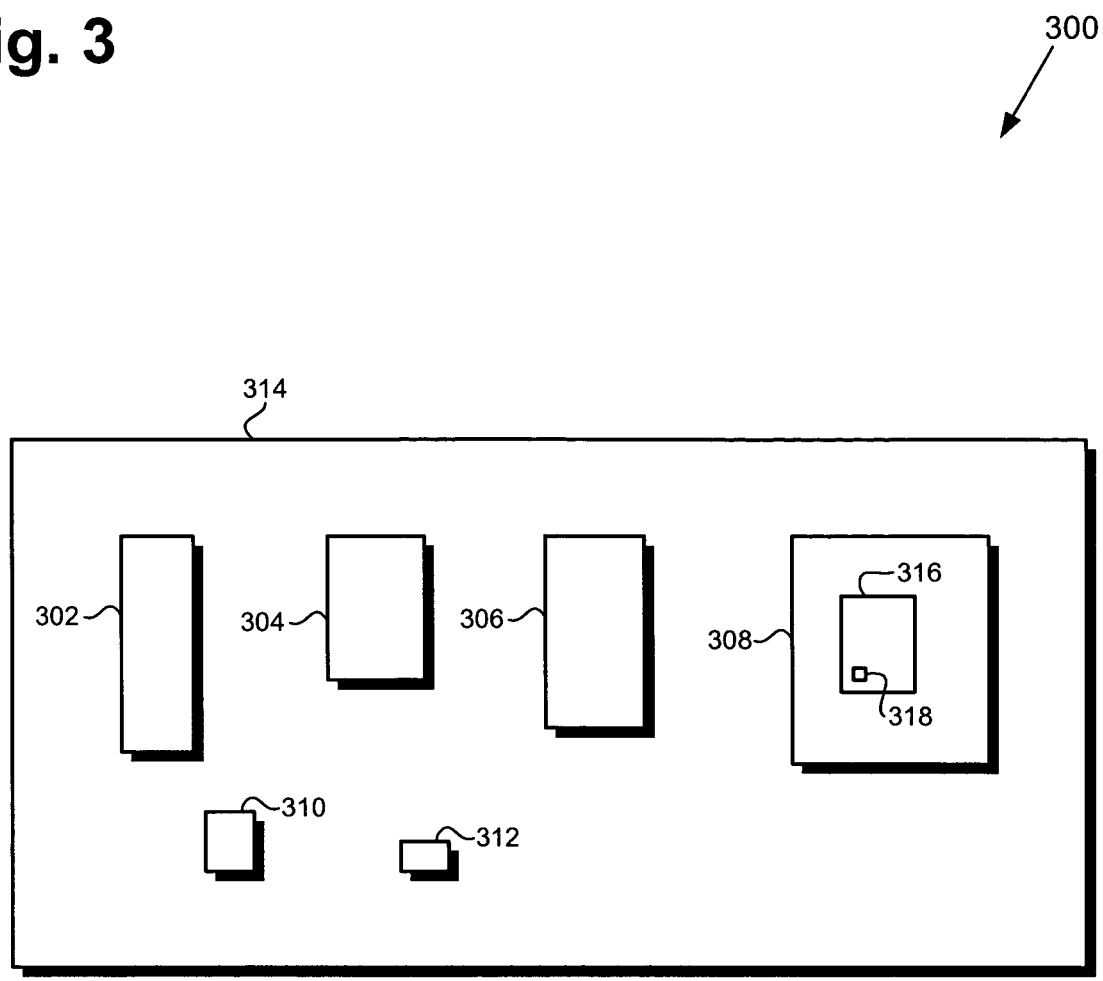
FIG. 3 illustrates a diagram of an exemplary electronic system including an exemplary chip or die utilizing one or more inductor-tuned buffer circuits designed in accordance with one embodiment of the present invention.

FIG. 3 illustrates a diagram of an exemplary electronic system including an exemplary chip or die utilizing one or more inductor-tuned buffer circuits in accordance with one embodiment of the present invention. Electronic system 300 includes exemplary modules 302, 304, and 306, IC chip 308, discrete components 310 and 312, residing in and interconnected through printed circuit board (PCB) 314. In one embodiment, electronic system 300 may include more than one PCB. IC chip 308 includes circuit 316, which utilizes one or more of the invention's inductor-tuned buffer circuits designated by numeral 318.

As shown in FIG. 3, modules 302, 304, and 306 are mounted on PCB 314 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. PCB 314 can include a number of interconnect traces (not shown in FIG. 3) for interconnecting modules 302, 304, and 306, discrete components 310 and 312, and IC chip 308.

Also shown in FIG. 3, IC chip 308 is mounted on PCB 314 and can be, for example, any chip utilizing an embodiment of the present invention's inductor-tuned buffer circuits. In one embodiment, IC chip 308 may not be mounted on PCB 314, and may be interconnected with other modules on different PCBs. As stated above, circuit 316 is situated in IC chip 308 and includes one or more of the invention's inductor-tuned buffer circuit(s) 318. Further shown in FIG. 3, discrete components 310 and 312 are mounted on PCB 314 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor. Discrete components 310 and 312 may themselves utilize one embodiment of the invention's inductor-tuned buffer circuit.

Electronic system 300 can be utilized in, for example, a wired or wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, or a digitally-controlled medical equipment, or in any other kind of system, device, component or module utilized in modern electronics applications.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an inductor-tuned buffer circuit with improved modeling and design has been described.

The invention claimed is:

1. A buffer circuit comprising:
   at least one input transistor for receiving a time varying input signal, said at least one input transistor driving an output of said buffer circuit;
   at least one buffer inductor coupled to said output of said buffer circuit;
   a capacitive load coupled to said output of said buffer circuit through an interconnecting conductor;
   a buffer parasitic inductance, a buffer parasitic capacitance, and a buffer parasitic resistance loading said at least one input transistor prior to said at least one input transistor being loaded by said at least one buffer inductor;
   said at least one buffer inductor being situated in proximity to said capacitive load so as to cause an interconnect parasitic inductance to be less than said at least one buffer inductor.

2. The buffer circuit of claim 1 wherein said at least one buffer inductor is situated in proximity to said capacitive load so as to cause said interconnect parasitic inductance to be less than half of an inductance of said at least one buffer inductor.

3. The buffer circuit of claim 1 wherein said at least one buffer inductor is tuned so that said at least one buffer inductor and said capacitive load resonate at a frequency of said time varying input signal.

4. The buffer circuit of claim 3 wherein said frequency is greater than 10.0 gigahertz.

5. The buffer circuit of claim 1 wherein said at least one input transistor is one of a pair of input transistors arranged in a differential pair configuration.

6. The buffer circuit of claim 1 wherein said at least one input transistor is an NMOS transistor.

7. The buffer circuit of claim 1 wherein said buffer circuit is utilized in a die, said die being part of an electronic system.

8. The buffer circuit of claim 7 wherein said electronic system is selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, digital avionics equipment, and a digitally-controlled medical equipment.

9. A buffer circuit comprising:
   at least one input transistor for receiving a time varying input signal, said at least one input transistor driving an output of said buffer circuit;
   at least one buffer inductor coupled to said output of said buffer circuit;
   a capacitive load coupled to said output of said buffer circuit through an interconnecting conductor;
   a buffer parasitic inductance, a buffer parasitic capacitance, and a buffer parasitic resistance loading said at least one input transistor prior to said at least one input transistor being loaded by said at least one buffer inductor;
   said at least one buffer inductor being situated in greater proximity to said capacitive load than to said input transistor, so as to cause an interconnect parasitic inductor to be less than said at least one buffer inductor.

10. The buffer circuit of claim 9 wherein said at least one buffer inductor is situated in greater proximity to said capacitive load than to said input transistor, so as to cause said interconnect parasitic inductor to be less than half of said at least one buffer inductor.

11. The buffer circuit of claim 9 wherein said at least one buffer inductor is tuned so that said at least one buffer inductor and said capacitive load resonate at a frequency of said time varying input signal.

12. The buffer circuit of claim 11 wherein said frequency is greater than 10.0 gigahertz.

13. The buffer circuit of claim 9 wherein said at least one input transistor is one of a pair of input transistors arranged in a differential pair configuration.

14. The buffer circuit of claim 9 wherein said at least one input transistor is an NMOS transistor.

15. The buffer circuit of claim 9 wherein said buffer circuit is utilized in a die, said die being part of an electronic system.

16. The buffer circuit of claim 15 wherein said electronic system is selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RE transceiver, a personal digital assistant (PDA), a digital game playing device, a digital testing and/or measuring equipment, digital avionics equipment, and a digitally-controlled medical equipment.

* * * * *